(12) United States Patent
Borthwick et al.

(10) Patent No.: US 7,812,589 B2
(45) Date of Patent: Oct. 12, 2010

(54) MODIFIED CURRENT SOURCE (MCS) WITH SEAMLESS RANGE SWITCHING

(75) Inventors: James Borthwick, Sunnyvale, CA (US); Peter P. Cuevas, Los Gatos, CA (US); Tal Raichman, San Francisco, CA (US)

(73) Assignee: QualiTau, Inc., Sunnyvale, CA (US)

( * ) Notice: Subject to any disclaimer, the term of this patent is extended or adjusted under 35 U.S.C. 154(b) by 285 days.

(21) Appl. No.: 12/200,764

(22) Filed: Aug. 28, 2008

(65) Prior Publication Data

US 2010/0052633 A1    Mar. 4, 2010

(51) Int. Cl.
G05F 3/02 (2006.01)
G01R 31/26 (2006.01)
(52) U.S. Cl. ..................... 323/354; 324/765
(58) Field of Classification Search ............... 323/299, 323/303, 304, 352, 353, 354, 369; 324/158.1, 324/763, 765; 702/64
See application file for complete search history.

(56) References Cited

U.S. PATENT DOCUMENTS

| | | | |
|---|---|---|---|
| 4,728,881 A * | 3/1988 | Evans et al. ................. | 323/353 |
| 5,579,236 A * | 11/1996 | Tamamura et al. ............ | 702/64 |
| 5,717,323 A | 2/1998 | Tailliet | |
| 6,292,690 B1 | 9/2001 | Petrucelli et al. | |
| 6,738,401 B2 | 5/2004 | Bowler et al. | |
| 7,098,648 B2 | 8/2006 | Krieger et al. | |
| 7,411,375 B2 * | 8/2008 | Konrad et al. ................. | 323/273 |
| 7,508,228 B2 * | 3/2009 | Walker et al. ................. | 324/765 |

OTHER PUBLICATIONS

International Search Report in Corresponding PCT Application No. PCT/US2009/052133, Mailed Sep. 23, 2009.
Written Opinion in Corresponding PCT Application No. PCT/US2009/052133, Mailed Sep. 23, 2009.

* cited by examiner

*Primary Examiner*—Gary L Laxton
(74) *Attorney, Agent, or Firm*—Beyer Law Group LLP

(57) ABSTRACT

A current source is provided with two resistor banks, and digital potentiometers are used to control how much each resistor bank affects the resulting output current. Furthermore, when the digital potentiometers are at a particular setting such that a particular resistor bank does not affect the resulting output current (i.e., the resistor bank is "inactive"), the resistance of that resistor bank can be switched without affecting the output current, thus minimizing or eliminating discontinuities in the output current during a current sweep operation. Thus, for example, when a resistor bank meets its threshold and becomes inactive, the resistance of the inactive resistor bank may be switched, and then the digital potentiometer setting may be changed to facilitate smoothly reactivating that resistor bank, with the new resistance.

9 Claims, 2 Drawing Sheets

*Fig. 1 (Not the Invention)*

MODIFIED CURRENT SOURCE (MCS) WITH SEAMLESS RANGE SWITCHING

BACKGROUND

High precision current sources are widely used in the process of testing and characterizing semiconductor devices. Such sources are often used in tests in which the sourced current is varied (swept) over several orders of magnitude (e.g., several pico-amperes to hundreds of mili-amperes).

As an example, we assume a logarithmic current sweep from a minimum current (Imin) to a maximum current (Imax), with Imin=100 pA and Imax=10 mA (i.e., eight orders of magnitude), with six steps per current decade (e.g., between 10 nA to 100 nA, the currents at each step would be 10 nA, 15.8 nA, 25.1 nA, 39.8 nA, 63.1 nA, and 100 nA, following the relation In/In−1=$10^{0.2}$). Given that, generally for such an application, the current should not return to zero between steps, internal adjustments should take place "on-the-fly", with minimal glitches or added noise on the actual current flowing to the DUT. As now discussed, this may be difficult to satisfy, since high-accuracy current sources usually rely on precision resistors (Rnet) for current sensing and feedback.

We now discuss this issue with reference to FIG. 1. The output of the N-bit DAC 102 is the input voltage (Vin) to the current source. The feedback voltage is the voltage drop across Rnet, namely Idut*Rnet (neglecting offset voltages and input currents), leading to the following relation:

$$I_{dut} R_{net} = V_{in} \quad (1)$$

or $$I_{dut} = \frac{V_{in}}{R_{net}} \quad (2)$$

Selecting the OpAmp 104 and the Diff Amp 106 to be high gain, low-leakage, and low offset (instrumentation-grade) components, the effect of Voff (offset voltage) and Iin (input leakage current) is basically negligible, except in situations with very low currents and very low levels of Vin. Furthermore, both Voff and Iin can be taken into account by measuring them separately at the beginning of each test, since they stay fairly stable as long as the temperature does not change significantly, and then compensating based on those measurements.

Precision DACs are usually limited to a relatively narrow voltage range (0 to ±2 Volt is typical). A 20-bit DAC (also typical for such applications) has a resolution of approximately $4/(2^{20})$ Volt~4 µV. If the maximum current is limited to 200 mA, for example, a combination of Vin=Vin (max)=2.0 V and Rnet=10Ω would be appropriate. On the other extreme, a current of 100 pA can be achieved with Vin=100 µV and Rnet=1 MΩ, or alternatively with Vin=10 mV and Rnet=100 MΩ (it is typically recommended to have Vin>>Voff, as long as it is possible).

Regardless of the specific selection of Vin, there is generally a need for a wide range of Rnet values. This by itself is not a problem, as long as the same Rnet is used for the entire experiment. Unfortunately, in tests involving current sweeps with a ratio of |Imax/Imin|>100 (two orders of magnitude), accommodating for a wide range of values is impractical. When voltage sources (VS) are used, switching different Rnet resistors in and out is possible, as long as switching transients are properly suppressed. Current sources (CS), on the other hand, rely on the voltage drop across Rnet to complete the feedback loop, meaning that in-line switching is fundamentally problematic.

SUMMARY

In accordance with an aspect, a current source is provided with two resistor banks, and digital potentiometers are used to control how much each resistor bank affects the resulting output current. Furthermore, when the digital potentiometers are at a particular setting such that a particular resistor bank does not affect the resulting output current (i.e., the resistor bank is "inactive"), the resistance of that resistor bank can be switched without affecting the output current, thus minimizing or eliminating discontinuities in the output current during a current sweep operation. Thus, for example, when a resistor bank meets its threshold and becomes inactive, the resistance of the inactive resistor bank may be switched, and then the digital potentiometer setting may be changed to facilitate smoothly reactivating that resistor bank, with the new resistance.

DETAILED DESCRIPTION

The inventors have realized that using a method and/or circuit such as described below, in-line switching of different Rnet resistors can occur as necessary, with no or minimal practical compromise on measurement accuracy, and no or minimal apparent glitch or noisy transients.

Figure 1:
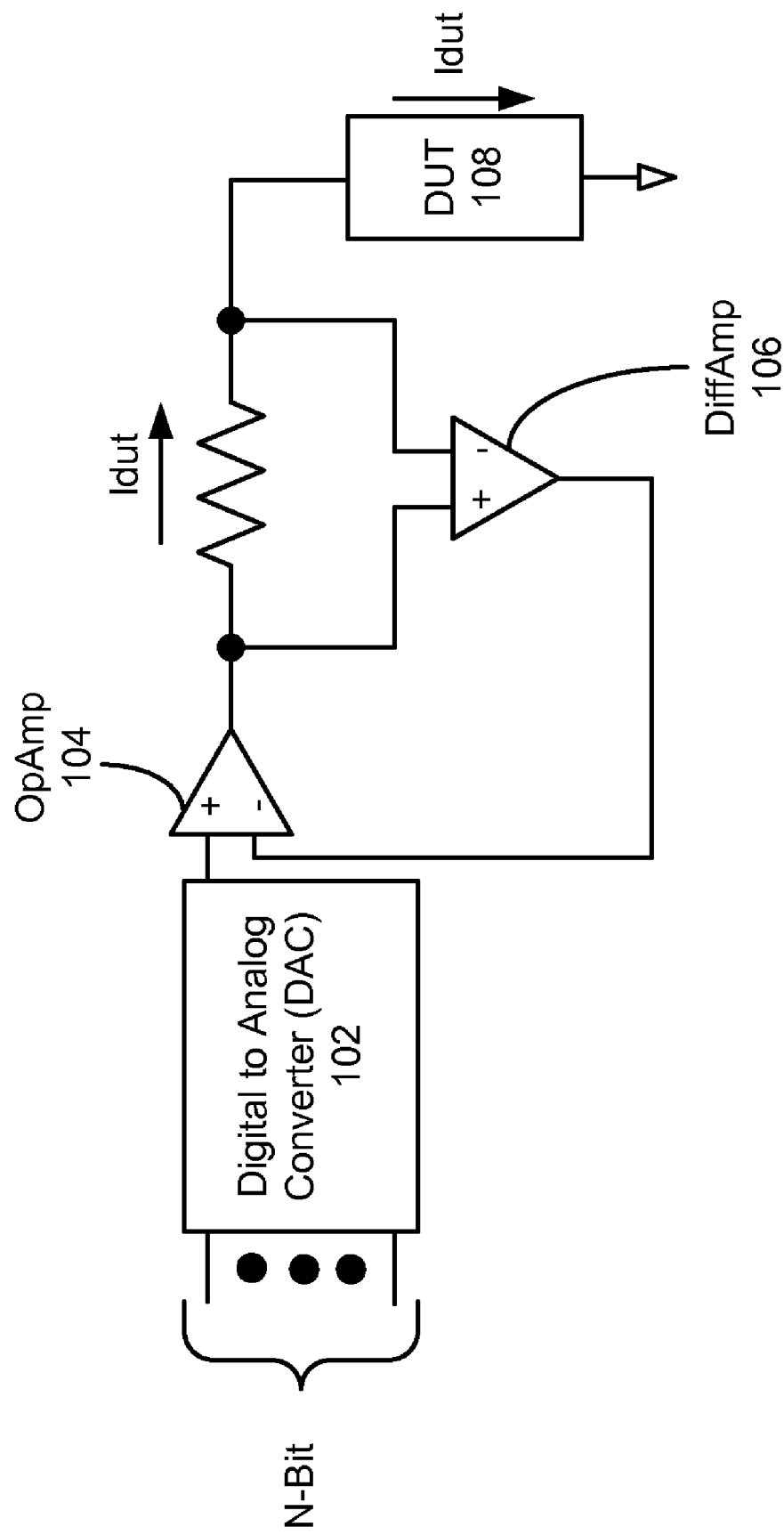
FIG. 1 illustrates a conventional current source.
Figure 2:
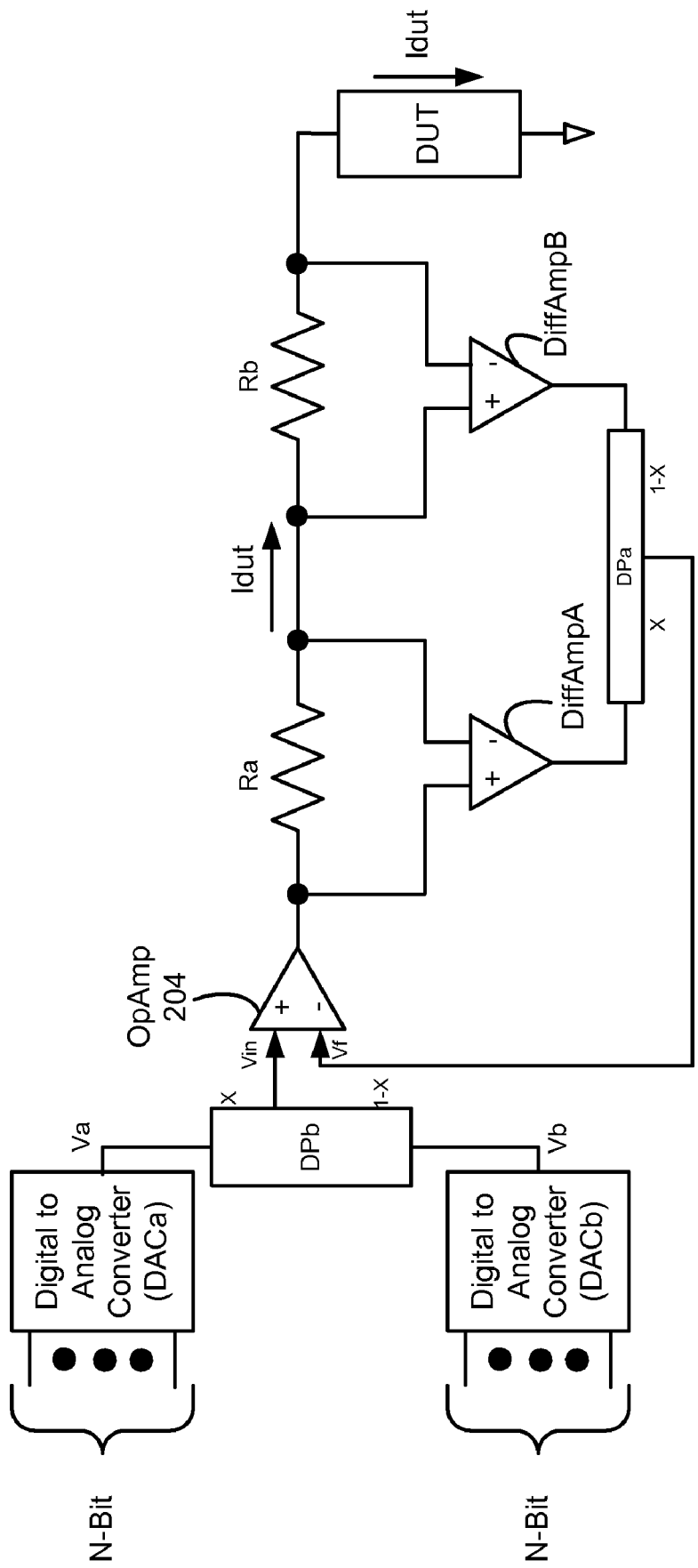
FIG. 2 illustrates a current source in accordance with an example embodiment.

FIG. 2 schematically illustrates an example embodiment, which is referred to as a "Modified Current Source" (MCS). The FIG. 2 current source is similar to the FIG. 1 current source, but with several significant differences. For example, two Rnet resistors, referred to in FIG. 2 as Ra and Rb, are provided in place of a single Rnet resistor, where each Rnet resistor in the FIG. 2 example has an associated Differential Amplifier (Diff Amp A and Diff Amp B, respectively). A component, called a Digital Potentiometer (DPa) is connected between the outputs of Diff Amp A and Diff Amp B, with its "movable" terminal connected to the inverting input of the OpAmp 204. A pair of DACs (DACa and DACb) are provide in place of the single DAC 102 of FIG. 1. A second Digital Potentiometer (DPb) is connected between the outputs of the two DACs (DACa and DACb), with its movable terminal connected to the non-inverting input of the OpAmp 204.

The Digital Potentiometers DPa and DPb may comprise, for example, electronic chips with a fixed precision resistance between their two "static terminals" (10 kΩ or 100 kΩ are typical values). The position of their "movable" terminal may be electronically (digitally) stepped to an appropriate position (a range of 100 steps is typical), so that "X" varies between zero and one (i.e. 0.00, 0.01, 0.02, . . . , 0.99, 1.00).

We now discuss an example operational scenario of the FIG. 2 circuit. In particular, the voltage at the inverting input of the OpAmp 204 (Vf), and the input voltage Vin can be characterized as:

$$V_f = I_{dut} R_a (1-X) + I_{dut} R_b X \quad (3)$$

$$V_{in} = V_a (1-X) + V_b X \quad (4)$$

Applying the equality between Vf and Vin (Voff neglected), using (3) and (4), an expression for Idut is easily obtained:

$$I_{dut} = \frac{V_a(1-X) + V_b X}{R_a(1-X) + R_b X} \quad (5)$$

To show how Idut may be kept the same even when Ra or Rb are switched (i.e. changed to a different value), the following information is provided:
(i) The ratio between Ra and Rb is either C or its reciprocal value 1/C, where C is an arbitrary constant (i.e. Ra=CRb or Ra=(1/C)Rb).
(ii) Similarly, Va=CVb or Va=(1/C)Vb.

Combining (i) and (ii), the following expression is obtained:

$$\frac{R_a}{R_b} = \frac{V_a}{V_b} = C \text{ or } 1/C \quad (6)$$

Substituting (6) in (5) for Ra=CRb, $$I_{dut} = \frac{V_a(1-X) + (1/C)V_a X}{R_a(1-X) + (1/C)R_a X} \quad (7)$$
$$= \frac{V_a[1-(1-1/C)X]}{R_a[1-(1-1/C)X]}$$
$$= \frac{V_a}{R_a}$$

Therefore, it can be seen that, for any value of X between 0.00 and 1.00, Idut depends only on the ratio Va/Ra and not on X. This result is similar when Ra=(1/C)Rb, since the term 1/C in both numerator and denominator of (7) becomes C, so the pre-factors of Va and Ra cancel out. The value of C may be set to 10, for example, to use the same value of Ra (Rb) for a complete number of current decades (practically one or two at most).

We now discuss an example of how the FIG. 2 circuit may be operated. To take advantage of (7), the value of X may be set to 0 when the following conditions are met: (i) Ra=10Rb; (ii) the voltage drop across Ra (IdutRa) is less than Vmax (Vmax is a parameter, usually in the range of 1.0 to 2.0 Volt). Similarly, X may be set to 1 when: (i) Rb=10Ra; (ii) the voltage drop across Rb (IdutRb) is below Vmax. In this situation, the resulting voltage drop across the entire Rnet (i.e. IdutRa+IdutRb) will not exceed 1.1 Vmax. In practice, real-time code to cause one of the resistors Ra and Rb to be switched may be configured to account for the expected next level of current, and at times makes the change in Ra or Rb when the related voltage drop is slightly less than Vmax, to avoid a large increase in the resulting voltage drop before Ra or Rb is changed. This situation is common for logarithmic current sweeps, as the current and the resulting voltage drop across Rnet may "jump" dramatically within a single step. In one example, the "switching out" of the larger of Ra and Rb may be accomplished using banks of different value resistors in Ra and Rb. Each of these resistors can be selected through a relay (switch) such that a larger value can be switched with a smaller value, or vice versa.

When the dominant voltage drop (namely IdutRa or IdutRb) exceeds Vmax (or is expected to exceed Vmax in the next current level), the value of X is changed gradually from 0 to 1 (in case Ra=10Rb) or from 1.0 to 0 (in case Rb=10Ra). The gradual change helps to avoid an abrupt disruption, which would not allow the feedback loop to compensate for the changes in voltage. For example, with Ra=10Rb, and when IdutRa reaches Vmax, X has to change from 0 to 1. X is incrementally changed from 0 to 0.01 on DPa and DPb practically simultaneously since they are both clocked with the same signal. Next, a similar step from X=0.01 to X=0.02 is followed, and so forth until X reaches one in both DPa and DPb. Theoretically, such incremental steps may introduce a small current glitch (e.g., less than 1% of Idut), but even such a small change is likely to be suppressed due to the internal time delay of the feedback loop.

Once the new value of X is established, the larger Rnet (either Ra or Rb, depending on the range) is switched out and a new resistor, 1/100 its resistance, is switched in instead. For example, If Ra was 1.0 MΩ and Rb was 100 kΩ, X was 0 as long as Idut*Rnet was below Vmax. Once Idut*Ra reaches a value either larger than Vmax or sufficiently close to Vmax for Rnet to change, X is changed from 0 to 1, as described above. Next, Ra is changed from 1.0 MΩ to 10 kΩ, so the new Rnet is made of Rb=100 kΩ and Ra=10 kΩ. Lastly, Va is changed to 0.01*Vmax (e.g., Vmax is 2.0 V, then Va is changed to 20 mV), so the appropriate ratio between Vb and Va is set. Note that the "new" voltage drop across Ra is 0.01 of its "old" value. Also, by now, Rb is the large Rnet, so Idut*Rnet is 0.1 of the value, which triggered the change from Ra=1.0 MΩ to Ra=10 kΩ, and the current sweep continues. Once the current reaches the level where Rb is to be changed, a similar sequence will follow, and so forth until the sweep is completed or the sweep direction is reversed (i.e., from increasing Idut to decreasing Idut).

When the sweep is "negative" (i.e. decreasing Idut), the switching point takes place when the voltage drop across the larger Rnet is just below 0.1V max. At this point, the smaller Rnet (i.e. Rb for X=0 or Ra for X=1) will be "replaced" by a new resistor, 100 times its value. For example, we consider the previous example where Ra=1.0 MΩ and Rb=100 kΩ, but this time for a negative current sweep (In<In−1). Since Ra=10Rb, X=0 as long as the value of Idut*Ra>0.1 Vmax. Once Idut*Ra drops further, X remains 0, but Rb is changed from 100 kΩ to 10 MΩ (a factor of 100). Only then, X is gradually changed from 0 to 1, following the same procedure as described above for the case of increasing current sweeps. At this point, the voltage drop across Rb is less than Vmax, and the current continues its decreasing sweep and so forth.

The value of X remains fixed, as long as neither Ra nor Rb is changed. Thus, the sensitivity of the MCS can be enhanced with a slight deviation from (6), as now explained. For example, having two DACs allows for increasing the current resolution considerably by setting X to a small value (X=δ<<1) instead of X=0.00, and to (1−δ) instead of X=1. In this case, one resistor network contributes substantially to the output of the current source whereas the other resistor network contributes much less than substantially to the output of the current source. Thus, for example, the limits of "substantially" are where X is 0.10 and 1−X is 0.90 (or vice versa), and the limits of "much less than substantially" are where X is 0.01 and 1−X is 0.99 (or vice versa). We now describe an example with typical Digital Potentiometers with 100 steps, where the value of X is set to 0.01. In this case, the Va contributes substantially and Vb contributes much less than substantially, using the limit set forth above. In this example, the resulting input voltage Vin becomes 0.99Va+0.01Vb for X=0.01 (instead of Va when X=0.00) and 0.01 Va+0.99Vb for X=0.99 (instead of Vb for X=1.00). By adjusting Vb around Va/10 in increments of one LSB (Least Significant Bit) up to 100 LSBs, the resolution of Vin is increased by a factor of 100. Changing Vb by one LSB results in Vin changing by 0.01 LSB; changing Vb by 100 LSBs causes Vin to change by one LSB. When X=0.99, Va is similarly changed around Vb/10.

The technique described above is applicable if the DACs are stable. If, on the other hand, the DAC output "wiggles" within ±LSB (perfectly within specs), the technique may not improve resolution at all. However, since state of the art DAC technology implies stable DACs, the proposed technique is indeed effective.

In general, a small change in Idut may be expressed as approximated by its total differential:

$$\Delta I_{dut} \approx \frac{\partial I_{dut}}{\partial V_a}\Delta V_a + \frac{\partial I_{dut}}{\partial V_b}\Delta V_b + \frac{\partial I_{dut}}{\partial X}\Delta X \tag{8}$$

More interestingly, the relative change with respect to Idut is:

$$\frac{\Delta I_{dut}}{I_{dut}} \approx \frac{1}{I_{dut}}\left[\frac{\partial I_{dut}}{\partial V_a}\Delta V_a + \frac{\partial I_{dut}}{\partial V_b}\Delta V_b + \frac{\partial I_{dut}}{\partial X}\Delta X\right] \tag{9}$$

Differentiating Idut (equation (5)) with respect to Va, Vb, and X gives:

$$\frac{\partial I_{dut}}{\partial V_a} = \frac{1-X}{R_a(1-X)+R_bX} \tag{10a}$$

$$\frac{\partial I_{dut}}{\partial Vb} = \frac{X}{R_a(1-X)+R_bX} \tag{10b}$$

$$\frac{\partial I_{dut}}{\partial X} = \frac{V_bR_a - V_aR_b}{[R_a(1-X)+R_bX][R_a(1-X)+R_bX]} \tag{10c}$$

Substituting (10a), (10b), (10c), and (6) into (9), and rearranging as necessary—the final expression for the relative change in Idut is obtained:

$$\frac{\Delta I_{dut}}{I_{dut}} \approx \frac{1-X}{V_a(1-X)+V_bX}\Delta V_a + \frac{X}{V_a(1-X)+V_bX} \tag{11}$$
$$\Delta V_b + +\frac{V_bR_a - V_aR_b}{[R_a(1-X)+R_bX][V_a(1-X)+V_bX]}\Delta X$$

A first observation is that, as long as VaRb=VbRa, incremental changes in X do not have any effect on Idut. This is the conclusion expressed in (6), which was obtained using a simpler and less formal approach. Based on that, the procedure to change Rnet, described above for the "ideal" case (i.e. VaRb=VbRa, and X=0 or 1.00 during steady state), may be modified by an initial step where the "Low Voltage" (Vb when X=0.01; Va when X=0.99) is adjusted to its "ideal" level (i.e. 1/C of the "High Voltage").

To quantify the impact of this step on Idut, the case where Ra=10Rb may be considered. Since neither X nor Va is changed while this new step is taken, the only change in Idut is caused by returning Vb to its ideal value, namely reducing (or increasing) it by 100 LSBs. If the range of the DACs is from 0 to ±Vmax, Vmax being its maximum output voltage, one LSB corresponds to $2V_{max}/2^n = V_{max}/2^{n-1}$, n being the number of bits (e.g. 12 for a 12-bit DAC, 16 for a 16-bit DAC, etc.). The maximum change in Vb (100 LSBs) is therefore $100V_{max}/2^{n-1}$. Now, the lowest level of Va is just prior to a range change during a high-to-low sweep. Assuming that Vmin is practically limited to Vmax/20 (a reasonable assumption since Va(max) should be relatively close to Vmax for efficient use of the entire DAC range), equation (11) takes the following form:

$$\frac{\Delta I_{dut}}{I_{dut}} \approx \frac{X}{V_a(1-X)+V_bX}\Delta V_b \tag{11}$$
$$= \frac{0.01 x 100 V\max}{2^{n-1}\left[0.99\frac{V\max}{20}+0.01\frac{V\max}{200}\right]}$$
$$\approx \frac{1.25}{2^{n-5}}$$

For 12-bit DACs, the ratio is about 1%, while for a 16-bit DAC, it is less than 0.1%. Clearly, this is a negligible tweak followed by a smooth transition, as described above for the "ideal" case.

In general, then, it can be seen that digital potentiometers are used to control how much each resistor bank affects the resulting output current. Furthermore, when the digital potentiometers are at a particular setting such that a particular resistor bank does not affect the resulting output current (i.e., the resistor bank is "inactive"), the resistance of that resistor bank can be switched without affecting the output current, thus minimizing or eliminating discontinuities in the output current during a current sweep operation. Thus, for example, when a resistor bank meets its threshold and becomes inactive, the resistance of the inactive resistor bank may be switched, and then the digital potentiometer setting may be changed to facilitate smoothly reactivating that resistor bank, with the new resistance (though there may be a slight pause in the current sweep as the resistor bank reaches its threshold and the new resistance for that resistor bank is switched in). An example of such switching is illustrated in the table below, which describes an example of the circuit parameters as the switching is accomplished.

| Va | 2 | 2 | 2 | 2 | 2 |
|---|---|---|---|---|---|
| Vb | 0.2 | 0.2 | 0.2 | 0.2 | 0.2 |
| Vin | 2 | 1.64 | 1.28 | 0.56 | 0.2 |
| Vf | 2 | 1.64 | 1.28 | 0.56 | 0.2 |
| VRa | 2 | 2 | 2 | 2 | 2 |
| VRb | 0.2 | 0.2 | 0.2 | 0.2 | 0.2 |
| Ra | 1000 ohms | 1000 ohms | 1000 ohms | 1000 ohms | 1000 ohms |
| Rb | 100 ohms | 100 ohms | 100 ohms | 100 ohms | 100 ohms |
| X | 0 | 0.2 | 0.4 | 0.8 | 1 |
| 1 − X | 1 | 0.8 | 0.6 | 0.2 | 0 |
| Output | 2 mA | 2 mA | 2 mA | 2 mA | 2 mA |

We have thus described a method and circuit that addresses inherent limitations of conventional current sources (CS), where some features of a modified current source (MCS) may include, in an example embodiment:

(i) Two Rnet resistors in series (Ra and Rb, which are selected resistors of a resistor bank, where each bank includes several resistors that are appropriate for the desired current range of the current source), where the ratio of their respective resistances is either 0.1 or 10.

(ii) Two identical DACs, where the ratio of their output voltages is set to 0.1 or 10, according to the resistor ratio described in (i) above.

(iii) Two digital potentiometers (DPa and DPb). The fixed terminals of DPa are connected to the oututs of the differential amplifiers of Ra and Rb, while the fixed terminals of DPb are connected to the output of DACs (Va and Vb). The "movable" terminals of DPa and DPb are connected to the inverting and to the non-inverting inputs of the operational amplifier, respectively.

(iv) The configuration described in (i)-(iii) above allows the feedback voltage Vf to follow either Idut*Ra or Idut*Rb, as appropriate. In addition, Rnet (i.e., Ra or Rb) can be replaced by a different resistor; all with no apparent current glitch or noise. Generally, the circuit facilitates a proportionality of output voltage depending on the relative contribution by the resistors and the resistance values of the resistors.

(v) Finally, operating in the optimized range of voltage drops across the larger Rnet (Ra or Rb) assures no compromise on accuracy and sensitivity.

(vi) Changing X to 0.01 (Ra>Rb) and 0.99 (Rb>Ra) from the respectively "ideal" 0.00 and 1.00 values, increases the overall source resolution by a factor of 100 (>6 digits).

What is claimed is:

1. A current source configured for substantially seamless range switching, comprising:
 a first resistor network having an input and an output, wherein the resistance of the first resistor network is dynamically configurable;
 a second resistor network having an input and an output, wherein the resistance of the second resistor network is dynamically configurable, the output of the first resistor network is connected to the input of the second resistor network, and the output of the second resistor network is configured to be connected to provide current to a device under test;
 a first differential amplifier having an output, a non-inverting input and an inverting input, the non-inverting input connected to the input of the first resistor network and the inverting input connected to the output of the first resistor network;
 a second differential amplifier having an output, a non-inverting input and an inverting input, the non-inverting input connected to the input of the second resistor network and the inverting input connected to the output of the second resistor network;
 a first digital potentiometer having a first input, a second input and an output, the first input connected to the output of the first differential amplifier and the second input connected to the output of the second differential amplifier, wherein the first digital potentiometer is configured to provide a signal at the output that includes, in a first selectable proportion, a combination of a signal at the first input of the first digital potentiometer and of a signal at the second input of the first digital potentiometer;
 an operational amplifier having a non-inverting input, an inverting input and an output, the output connected to the input of the first resistor network and the inverting input connected to the output of the first digital potentiometer; and
 a second digital potentiometer having a first input, a second input and an output, wherein the second digital potentiometer is configured to provide a signal at the output that includes, in a second selectable proportion, a combination of a signal at the first input of the second digital potentiometer and of a signal at the second input of the second digital potentiometer, the output of the second digital potentiometer connected to the non-inverting input of the operational amplifier.

2. The current source of claim 1, further comprising:
 a first digital to analog converter, having an output connected to the first input of the second digital potentiometer; and
 a second digital to analog converter, having an output connected to the second input of the second digital potentiometer.

3. The current source of claim 1, wherein:
 the current source is configured such that the first selectable proportion and the second selectable proportion are constrained to be substantially identical.

4. The current source of claim 1, wherein:
 the current source is configured such that the first selectable proportion is selectable to be X to 1−X, where X is a real non-negative number less than or equal to 1.0.

5. The current source of claim 1, wherein:
 the second selectable proportion is selectable to be X to 1−X, where X is a real non-negative number less than or equal to 1.0.

6. The current source of claim 1, wherein:
 the current source is configured such that the first selectable proportion and the second selectable proportion are constrained to be substantially identical; and
 the current source is configured such that the first and second selectable proportions are selectable to be X to 1−X, where X is a real non-negative number less than or equal to 1.0.

7. The current source of claim 6, wherein:
 the current source is configured such that, for two particular values of X, namely X=0 and X=1, only one of the first and second resistor banks contributes to the current to be provided to the device under test.

8. A method of operating a current source, comprising:
 a) configuring the current source such that both a first resistor network and a second resistor network of the current source contribute to providing current to an output of the current source;
 b) adjusting a current control input to the current source to cause the provided current at the output of the current source to change;
 c) adjusting a resistor network control input to the current source such that the first resistor network does not contribute to providing current to the output of the current source and, while the first resistor network does not contribute to providing current to the output of the current source, modifying a resistance of the first resistor network;
 d) adjusting the resistor network control input to the current source such that the first resistor network again contributes to providing current to the output of the current source;
 e) repeating b);
 f) adjusting the resistor network control input until the second resistor network does not contribute to providing current to the output of the current source and, while the second resistor network does not contribute to providing current to the output of the current source, modifying a resistance of the second resistor network;
 g) repeating steps b) to f) to achieve a range of values of the current provided to the output of the current source.

9. A method of operating a current source, comprising:
 a) configuring the current source such that both a first resistor network and a second resistor network of the current source contribute to providing current to an output of the current source, wherein the first resistor network contributes substantially to providing current to the output of the current source and wherein the second resistor network contributes much less than substantially to providing current to the output of the current source;

b) adjusting a current control input to the current source to cause the provided current at the output of the current source to change;

c) adjusting a resistor network control input to the current source such that the second resistor network contributes substantially to providing current to the output of the current source and the first resistor network contribute much less than substantially to providing current to the output of the current source, and modifying a resistance of the first resistor network;

d) repeating b);

e) adjusting the resistor network control input until the first resistor network contributes substantially to providing current to the output of the current source and wherein the second resistor network contributes much less than substantially to providing current to the output of the current source; and modifying a resistance of the second resistor network;

f) repeating steps b) to e) to achieve a range of values of the current provided to the output of the current source.

* * * * *